United States Patent
Okubo et al.

(10) Patent No.: US 12,143,096 B2
(45) Date of Patent: Nov. 12, 2024

(54) FILTER DEVICE AND FILTER CIRCUIT

(71) Applicant: Murata Manufacturing Co., Ltd., Nagaokakyo (JP)

(72) Inventors: Kota Okubo, Nagaokakyo (JP); Takayuki Okude, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 839 days.

(21) Appl. No.: 17/189,339

(22) Filed: Mar. 2, 2021

(65) Prior Publication Data
US 2021/0305967 A1 Sep. 30, 2021

(30) Foreign Application Priority Data

Mar. 27, 2020 (JP) .................................. 2020-058850
Jun. 10, 2020 (JP) .................................. 2020-100850

(51) Int. Cl.
*H03H 9/64* (2006.01)
*H03H 9/02* (2006.01)
*H03H 9/145* (2006.01)
*H03H 9/25* (2006.01)

(52) U.S. Cl.
CPC ...... *H03H 9/6483* (2013.01); *H03H 9/02543* (2013.01); *H03H 9/145* (2013.01); *H03H 9/25* (2013.01)

(58) Field of Classification Search
CPC .......... H03H 9/02; H03H 9/125; H03H 9/145; H03H 9/25; H03H 9/54; H03H 9/64
See application file for complete search history.

(56) References Cited

U.S. PATENT DOCUMENTS

| 7,151,310 | B2 | 12/2006 | Nakano | |
| 8,648,673 | B2* | 2/2014 | Omura | H03H 9/725 |
| | | | | 333/195 |
| 10,419,038 | B2* | 9/2019 | Sugimoto | H03H 9/568 |
| 10,693,440 | B2* | 6/2020 | Ohkubo | H03H 9/0552 |

FOREIGN PATENT DOCUMENTS

| JP | 05-243415 A | 9/1993 |
| JP | 06-244244 A | 9/1994 |
| JP | 06-303093 A | 10/1994 |
| JP | 2015-156626 A | 8/2015 |

* cited by examiner

*Primary Examiner* — Andrea Lindgren Baltzell
*Assistant Examiner* — Alan Wong
(74) *Attorney, Agent, or Firm* — Keating & Bennett, LLP

(57) ABSTRACT

A filter device includes a first substrate, a first input electrode and a first output electrode on the first substrate, a first ground electrode on the first substrate and receiving a ground potential, an electrically open portion in or on the first substrate, a second substrate mounted on the first substrate, a second input electrode on a surface of the second substrate and connected to the first input electrode, a second output electrode on the surface of the second substrate and connected to the first output electrode, a second ground electrode on the surface of the second substrate and connected to the first ground electrode, and at least one first functional electrode on the second substrate and disposed on a first connecting path connecting the second input electrode and the second output electrode. The open portion is connected to the first connecting path.

15 Claims, 15 Drawing Sheets

FILTER DEVICE AND FILTER CIRCUIT

CROSS REFERENCE TO RELATED APPLICATIONS

This application claims the benefit of priority to Japanese Patent Application No. 2020-100850 filed on Jun. 10, 2020 and Japanese Patent Application No. 2020-058850 filed on Mar. 27, 2020. The entire contents of these applications are hereby incorporated herein by reference.

BACKGROUND OF THE INVENTION

1. Field of the Invention

The present invention relates to a filter device and a filter circuit.

2. Description of the Related Art

Hitherto, a filter device that allows signals of a specific frequency band to pass therethrough is mounted on a wireless communication apparatus, such as a cellular phone. For example, Japanese Unexamined Patent Application Publication No. 06-303093 discloses a ladder filter device including series arm resonators and parallel arm resonators connected with each other in a ladder configuration.

When a signal is input into a filter device, a resonator included in the filter device resonates, thereby converting a signal into vibration and vibration into a signal. At this time, the resonator generates heat, which increases the temperature of the resonator.

When electric power of a signal input into the filter device is elevated, the temperature of the resonator sharply rises. If the resonator reaches a certain temperature, electrochemical migration may occur in a metal forming the resonator, which may short-circuit the resonator. This may lead to the degradation of the filter characteristics of the filter device. It is thus desirable to improve the electric power handling capability of the filter device.

SUMMARY OF THE INVENTION

Preferred embodiments of the present invention provide filter devices and filter circuits that are each able to improve the electric power handling capability.

According to a preferred embodiment of the present invention, a filter device includes a first substrate, a first input electrode provided on the first substrate, a first output electrode provided on the first substrate, a first ground electrode that is provided on the first substrate and receives a ground potential, an open portion that is electrically open and is provided in or on the first substrate, a second substrate mounted on the first substrate, a second input electrode provided on a surface of the second substrate and connected to the first input electrode, a second output electrode provided on the surface of the second substrate and connected to the first output electrode, a second ground electrode provided on the surface of the second substrate and connected to the first ground electrode, and at least one first functional electrode provided on the surface of the second substrate and disposed on a first connecting path, the first connecting path connecting the second input electrode and the second output electrode. The open portion is connected to the first connecting path.

According to another preferred embodiment of the present invention, a filter circuit includes an input terminal, an output terminal, at least one resonator disposed on a connecting path, the connecting path connecting the input terminal and the output terminal, and an open terminal that is electrically open and connected to the connecting path.

According to preferred embodiments of the present invention, it is possible to provide filter devices and filter circuits that are each able to improve the electric power handling capability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

First Preferred Embodiment

Figure 1:
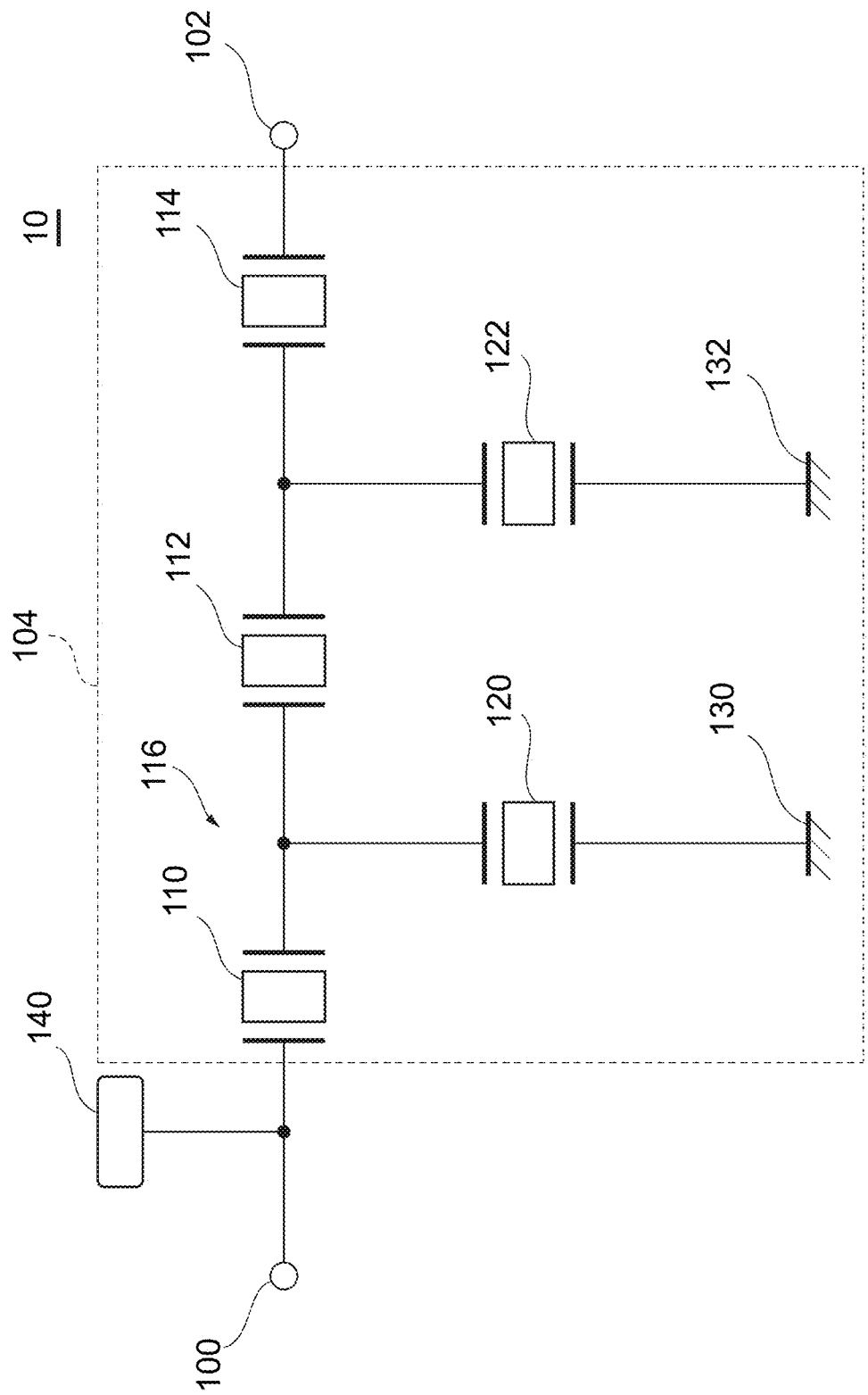
FIG. 1 is a circuit diagram of a filter device according to a first preferred embodiment of the present invention.

FIG. 1 is a circuit diagram of a filter device 10 according to a first preferred embodiment of the present invention. The filter device 10 is a filter circuit that allows a signal of a predetermined frequency band to pass therethrough and attenuates signals of the other frequency bands. The filter device 10 is a ladder filter including multiple resonators disposed on a series arm and parallel arms.

The filter device 10 includes an input terminal 100, an output terminal 102, a filter 104, and an open terminal 140. A signal is input into the input terminal 100 and is output from the output terminal 102.

The filter 104 includes three series arm resonators 110, 112, and 114, two parallel arm resonators 120 and 122, and two ground terminals 130 and 132. The numbers of series arm resonators, parallel arm resonators, ground terminals, and open terminals are only examples and are not limited thereto.

Each of the series arm resonators 110, 112, and 114 and the parallel arm resonators 120 and 122 is not restricted to a particular device, and may be a surface acoustic wave (SAW) resonator, a piezoelectric thin-film resonator, or a bulk acoustic wave (BAW) resonator, for example. The first preferred embodiment will be described, assuming that the series arm resonators and the parallel arm resonators are SAW resonators. Various other resonators described below may also be defined by any of the above-described types of devices.

On a first connecting path 116 (also referred to as a series arm) which connects the input terminal 100 and the output terminal 102, the three series arm resonators 110, 112, and 114 are connected in series with each other in this order as viewed from the input terminal 100.

The two parallel arm resonators 120 and 122 branch off from the series arm and are connected in parallel with each other in this order as viewed from the input terminal 100. The parallel arm resonator 120 is disposed on a path (second connecting path) which connects the ground terminal 130 and a node between the series arm resonators 110 and 112. The parallel arm resonator 122 is disposed on a path (second connecting path) which connects the ground terminal 132 and a node between the series arm resonators 112 and 114. A ground potential is supplied to each of the two ground terminals 130 and 132.

The open terminal 140 is connected to the series arm. The open terminal 140 is electrically open so as to provide the function as an open stub.

In the specification, "open" refers to the state in which one end of an element is electrically open. In terms of the impedance, when the impedance of one end of an element is about ten times or more as high as the normalized impedance (for example, about 50Ω), the element is open.

Figure 2:
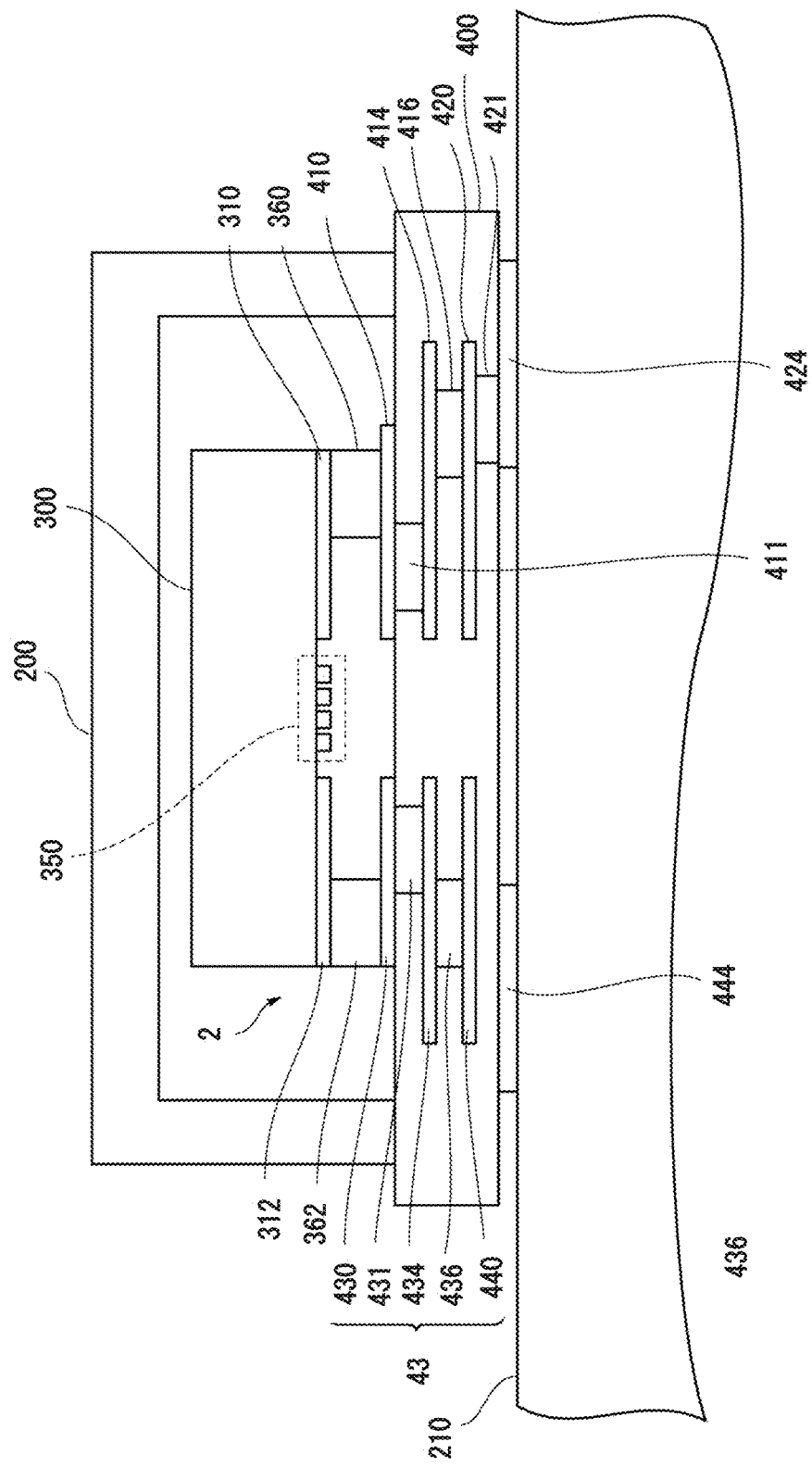
FIG. 2 is a schematic sectional view of a filter device according to the first preferred embodiment of the present invention.
Figure 3:
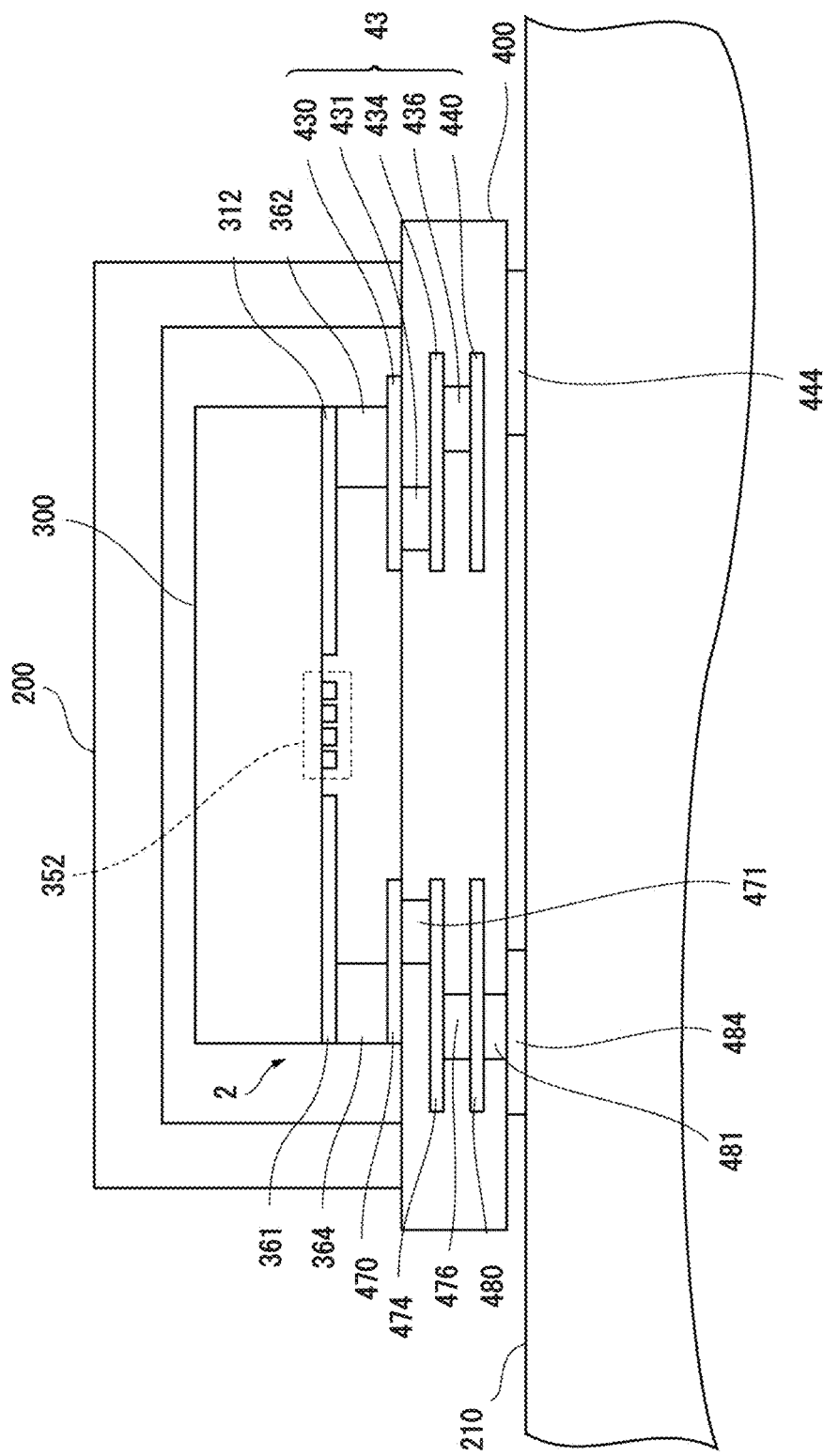
FIG. 3 is a schematic sectional view of the filter device according to the first preferred embodiment of the present invention as viewed from a direction different from that in FIG. 2.

FIG. 2 is a schematic sectional view of a filter device 2 according to the first preferred embodiment. FIG. 3 is a schematic sectional view of the filter device 2 as viewed from a direction different from that in FIG. 2. As shown in FIGS. 2 and 3, the filter device 2 includes a multilayer substrate 400 (first substrate) and a piezoelectric substrate 300 (second substrate) mounted on the multilayer substrate 400. In the first preferred embodiment, a piezoelectric substrate made of, for example, a piezoelectric member is used as the second substrate. However, the second substrate may alternatively be, for example, a silicon substrate having a piezoelectric film provided on the surface of the substrate. A cover 200 covers the piezoelectric substrate 300. A motherboard 210 is connected to various electrodes provided on the bottom surface of the multilayer substrate 400. Various potentials are supplied to these electrodes from the motherboard 210. In the specification, the multilayer substrate 400 is mainly used as the first substrate of the filter device 2, but it is only an example.

s shown in FIGS. 2 and 3, various electrodes are provided on the main surface of the piezoelectric substrate 300. For example, interdigital transducer (IDT) electrodes 350 and 352 defining resonators are provided on the main surface of the piezoelectric substrate 300. The piezoelectric substrate 300 and the IDT electrodes define piezoelectric elements (for example, SAW resonators in the first preferred embodiment).

Figure 4:
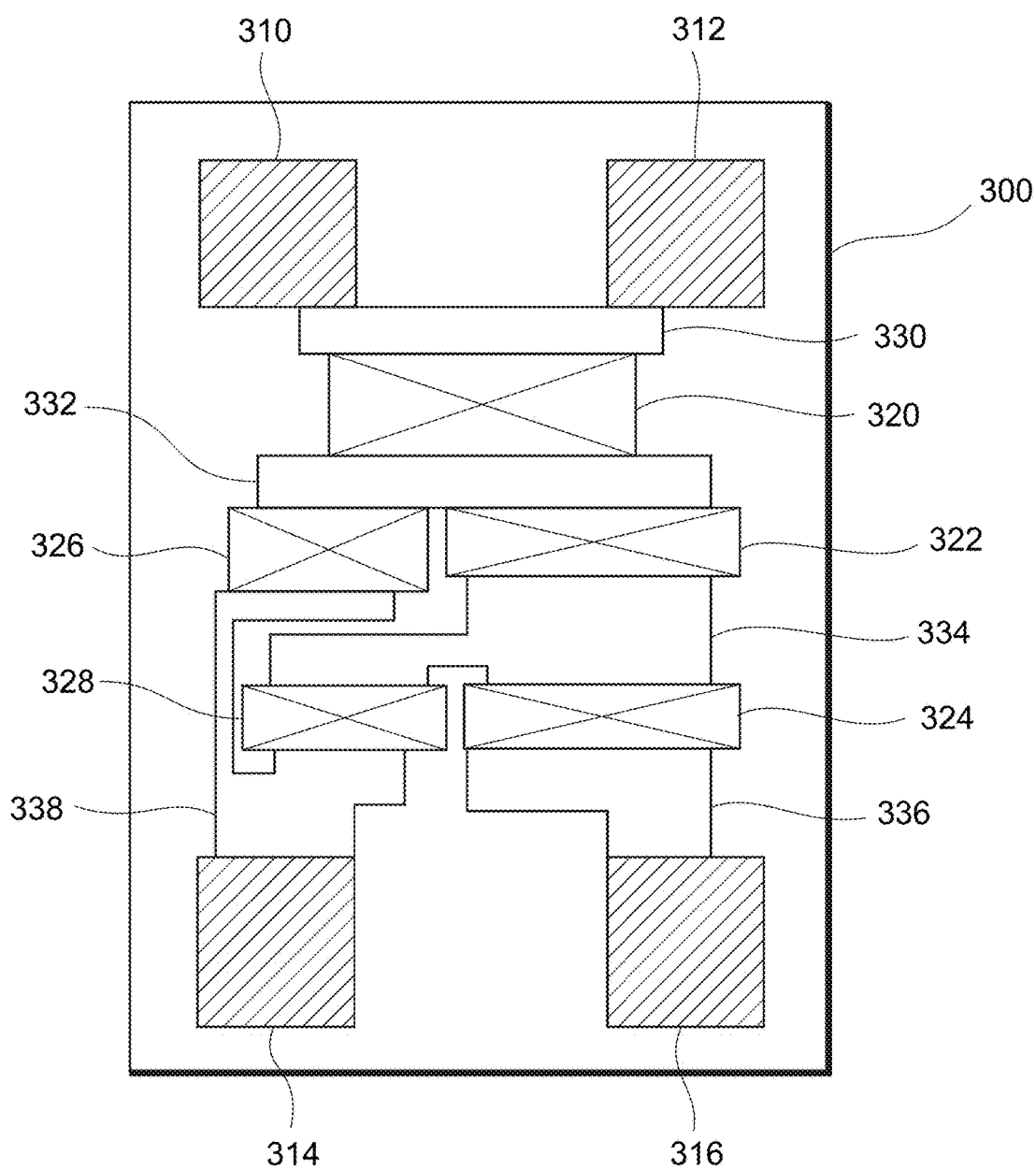
FIG. 4 is a schematic view illustrating the main surface of a second substrate in the first preferred embodiment of the present invention.

FIG. 4 is a schematic view illustrating the main surface of the piezoelectric substrate 300. As shown in FIG. 4, on the main surface of the piezoelectric substrate 300, an input electrode 310 (second input electrode), an open electrode 312, a ground electrode 314 (second ground electrode), and an output electrode 316 (second output electrode) are provided. Five IDT electrodes 320, 322, 324, 326, and 328 defining resonators are also provided on the main surface of the piezoelectric substrate 300. It is assumed that the IDT electrode 320 defines the series arm resonator 110, the IDT electrode 322 defines the series arm resonator 112, the IDT electrode 324 defines the series arm resonator 114, the IDT electrode 326 defines the parallel arm resonator 120, and the IDT electrode 328 defines the parallel arm resonator 122. In the specification, the IDT electrodes 320, 322, and 324 defining the series arm resonators are also referred to as first functional electrodes, while the IDT electrodes 326 and 328 defining the parallel arm resonators are also referred to as second functional electrodes.

The open electrode 312 is connected to an electrode 330 which connects the input electrode 310 and the IDT electrode 320. The IDT electrode 320 is connected to the IDT electrodes 322 and 326 via an electrode 332. The IDT electrode 322 is connected to the IDT electrodes 324 and 328 via an electrode 334. The IDT electrode 324 is connected to the output electrode 316 via an electrode 336. The IDT electrode 326 is connected to the IDT electrode 328 and the ground electrode 314 via an electrode 338.

With the above-described configuration, the input electrode 310 and the output electrode 316 are connected with each other via the electrode 330, the IDT electrode 320, the electrode 332, the IDT electrode 322, the electrode 334, the IDT electrode 324, and the electrode 336. The electrode 330 connected to the open electrode 312 forms part of the path (first connecting path) which connects the input electrode 310 and the output electrode 316.

Figure 5:
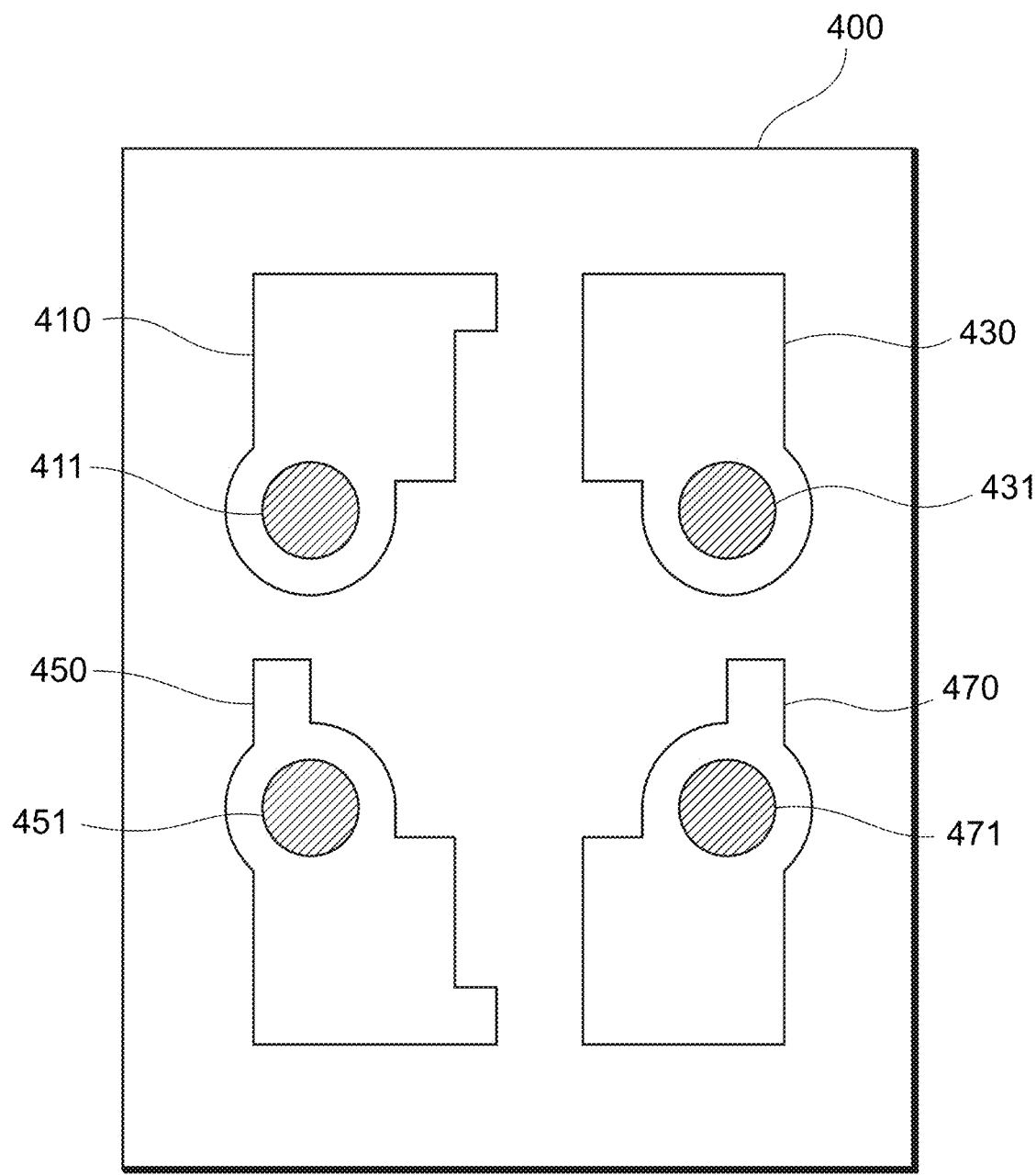
FIG. 5 is a schematic view illustrating the top surface of a multilayer substrate.
Figure 6:
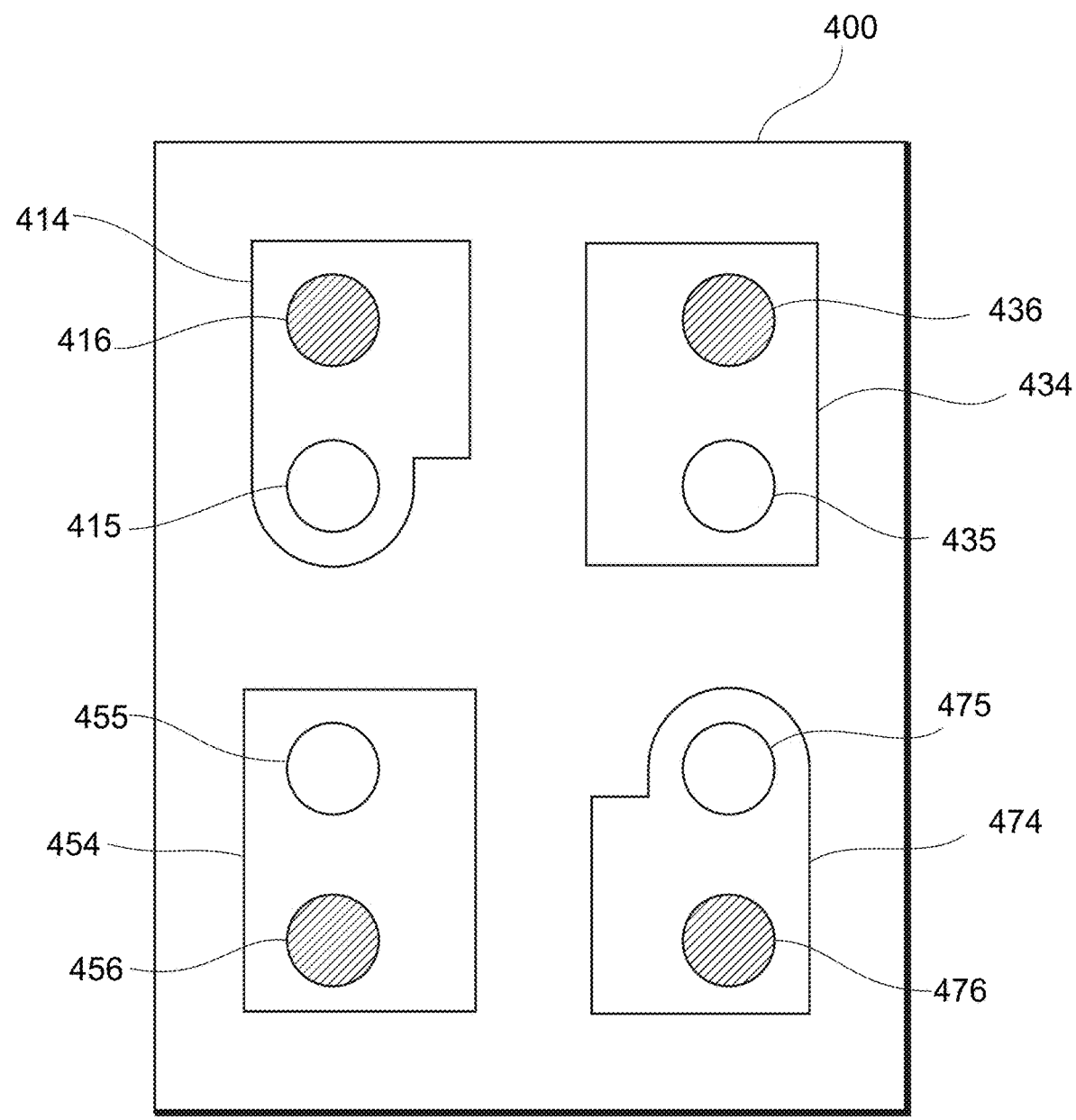
FIG. 6 is a schematic view illustrating a second layer of the multilayer substrate.
Figure 7:
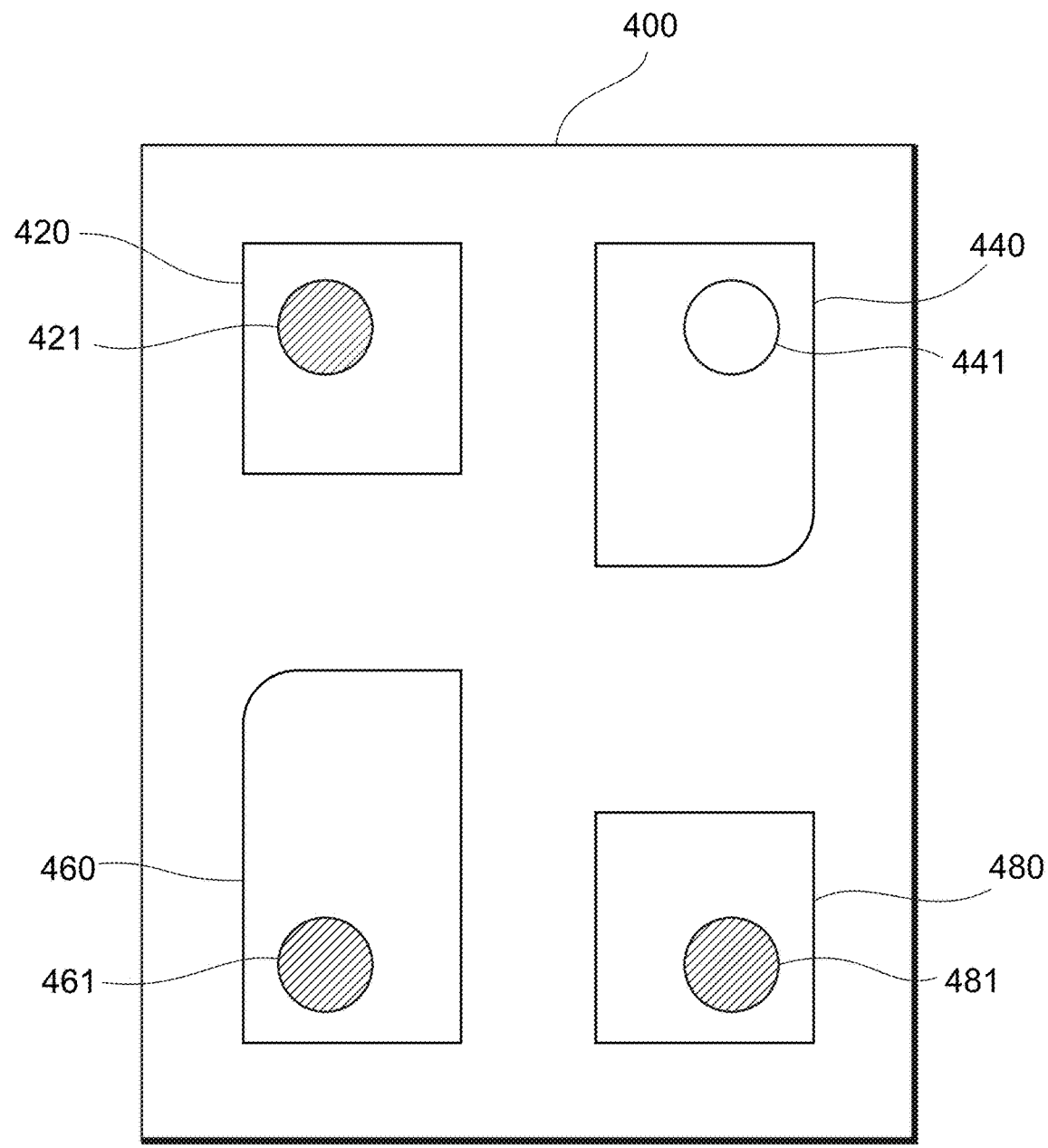
FIG. 7 is a schematic view illustrating a third layer of the multilayer substrate.
Figure 8:
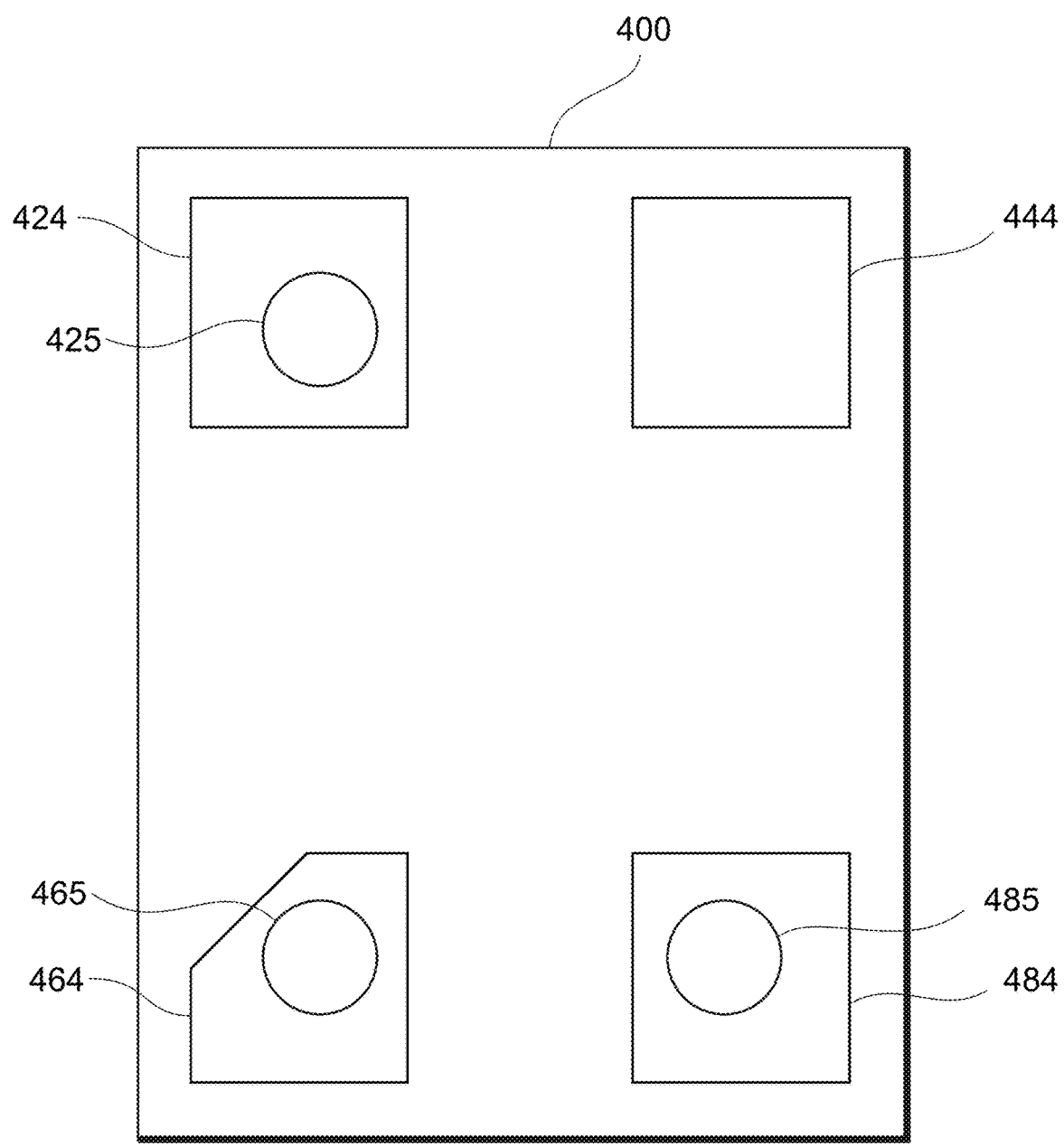
FIG. 8 is a schematic view illustrating the bottom surface of the multilayer substrate.

Referring back to FIG. 2, the multilayer substrate 400 will be described. Various electrodes are disposed on the top surface, a second layer, a third layer, and the bottom surface of the multilayer substrate 400. FIG. 5 is a schematic view illustrating the top surface of the multilayer substrate 400. FIG. 6 is a schematic view illustrating the second layer of the multilayer substrate 400. FIG. 7 is a schematic view illustrating the third layer of the multilayer substrate 400. FIG. 8 is a schematic view illustrating the bottom surface of the multilayer substrate 400.

As shown in FIG. 5, four electrodes 410, 430, 450, and 470 are provided on the top surface of the multilayer substrate 400. As shown in FIG. 2, the electrode 410 is connected to the input electrode 310 provided on the main surface of the piezoelectric substrate 300 via a bump 360. The electrode 430 is connected to the open electrode 312 provided on the main surface of the piezoelectric substrate 300 via a bump 362. As shown in FIG. 3, the electrode 470 is connected to the output electrode 316 provided on the main surface of the piezoelectric substrate 300 via a bump 364. The electrode 450 is connected to the ground electrode 314 provided on the main surface of the piezoelectric substrate 300 via a bump (not shown).

Referring back to FIG. 5, a via-hole electrode 411 of the electrode 410 provided on the top surface of the multilayer substrate 400 is connected to a region 415 of an electrode 414 on the second layer of the multilayer substrate 400 shown in FIG. 6. A via-hole electrode 416 of the electrode 414 is connected to an electrode 420 on the third layer of the multilayer substrate 400 shown in FIG. 7. A via-hole electrode 421 of the electrode 420 is connected to a region 425 of an input electrode 424 (first input electrode) on the bottom surface of the multilayer substrate 400 shown in FIG. 8. An input potential is supplied from the motherboard 210 to the input electrode 424. With the above-described configuration, the input electrode 424 provided on the multilayer substrate 400 is connected to the input electrode 310 provided on the main surface of the piezoelectric substrate 300 via the electrodes 420, 414, and 410 and the bump 360.

Referring back to FIG. 5, a via-hole electrode 431 of the electrode 430 provided on the top surface of the multilayer substrate 400 is connected to a region 435 of an electrode 434 on the second layer of the multilayer substrate 400 shown in FIG. 6. A via-hole electrode 436 of the electrode 434 is connected to a region 441 of an electrode 440 on the third layer of the multilayer substrate 400 shown in FIG. 7. The electrode 440 is not connected to any electrodes on the bottom surface of the multilayer substrate 400 (including an electrode 444 shown in FIG. 8) other than to the via-hole electrode 436. The electrode 440 is thus electrically open. The electrodes 430, 434, and 440 are electrically connected with each other and define an open portion 43. Since the electrode 440 is electrically open, the open portion 43 is also electrically open. The open portion 43 is connected via the bump 362 and the open electrode 312 to the path which connects the input electrode 310 and the output electrode 316 provided on the main surface of the piezoelectric substrate 300.

Referring back to FIG. 5, a via-hole electrode 451 of the electrode 450 provided on the top surface of the multilayer substrate 400 is connected to a region 455 of an electrode 454 on the second layer of the multilayer substrate 400 shown in FIG. 6. A via-hole electrode 456 of the electrode 454 is connected to an electrode 460 on the third layer of the multilayer substrate 400 shown in FIG. 7. A via-hole electrode 461 of the electrode 460 is connected to a region 465 of a ground electrode 464 (first ground electrode) on the bottom surface of the multilayer substrate 400 shown in FIG. 8. A ground potential is supplied from the motherboard 210 to the ground electrode 464. With the above-described configuration, the ground electrode 464 provided on the bottom surface of the multilayer substrate 400 is connected to the ground electrode 314 provided on the main surface of the piezoelectric substrate 300 via the electrodes 460, 454, and 450 and a bump (not shown).

Referring back to FIG. 5, a via-hole electrode 471 of the electrode 470 provided on the top surface of the multilayer substrate 400 is connected to a region 475 of an electrode 474 on the second layer of the multilayer substrate 400 shown in FIG. 6. A via-hole electrode 476 of the electrode 474 is connected to an electrode 480 on the third layer of the multilayer substrate 400 shown in FIG. 7. A via-hole electrode 481 of the electrode 480 is connected to a region 485 of an output electrode 484 (first output electrode) on the bottom surface of the multilayer substrate 400 shown in FIG. 8. With the above-described configuration, the output electrode 484 provided on the bottom surface of the multilayer substrate 400 is connected to the output electrode 316 (second output electrode) provided on the main surface of the piezoelectric substrate 300 via the electrodes 480, 474, and 470 and the bump 364.

The configuration of the filter device 2 according to the first preferred embodiment has been described. In the first preferred embodiment, the open portion 43, which is electrically open, is connected to the path which connects the input electrode 310 (second input electrode) and the output electrode 316 (second output electrode) provided on the surface of the piezoelectric substrate 300.

In the first preferred embodiment, heat generated in the resonators defined by the IDT electrodes due to input of electric power into the filter device 2 is dissipated by the open portion 43. For example, heat generated in the resonators is transferred to the open portion 43 via the open electrode 312 and further to the multilayer substrate 400 and the motherboard 210. In this manner, heat is dissipated from the resonators, thus regulating a temperature rise in the resonators.

As electric power input into the filter device 10 is elevated, the amount of heat generated in the resonators is increased. In the filter device 2 of the first preferred embodiment, heat generated in the resonators is dissipated, and thus, even with an increase in electric power input into the filter device 2, a temperature rise in the resonators is regulated. As a result, the electric power handling capability of the filter device 2 is improved.

In the first preferred embodiment, among the resonators (series arm resonators) disposed on the first connecting path, the open portion 43 is electrically connected to the series arm resonator 110 located most closely to the input terminal 100.

Among the three series arm resonators 110, 112, and 114, the series arm resonator 110 is positioned electrically most closely to the input terminal 100 and thus generates a greater amount of heat than the other two series arm resonators 112 and 114. The series arm resonator 110 is thus more likely to be at high temperatures. In the filter device 2 of the first preferred embodiment, the open terminal 140 is electrically connected to the series arm resonator 110. This facilitates the dissipation of heat from the series arm resonator 110 compared with from the other two series arm resonators 112 and 114, thus preventing an excessive temperature rise in the series arm resonator 110. As a result, the electric power handling capability of the filter device 2 is further improved.

The open terminal 140 of the filter device 10 of the first preferred embodiment defines and functions as an open stub. Unwanted harmonic wave components are thus reflected due to impedance mismatching. A signal reflected by the open stub is out of phase with harmonic wave components input into the filter device 10 by about 180°. The reflected signal thus cancels out the unwanted harmonic wave components. As a result, the bandpass characteristics and attenuation characteristics of the filter device 10 are improved.

Second Preferred Embodiment

Other preferred embodiments will be described below by referring to points different from the first preferred embodiment while omitting the same or similar points as the first preferred embodiment. Similar advantages obtained by similar configurations are not repeated in the individual preferred embodiments.

Figure 9:
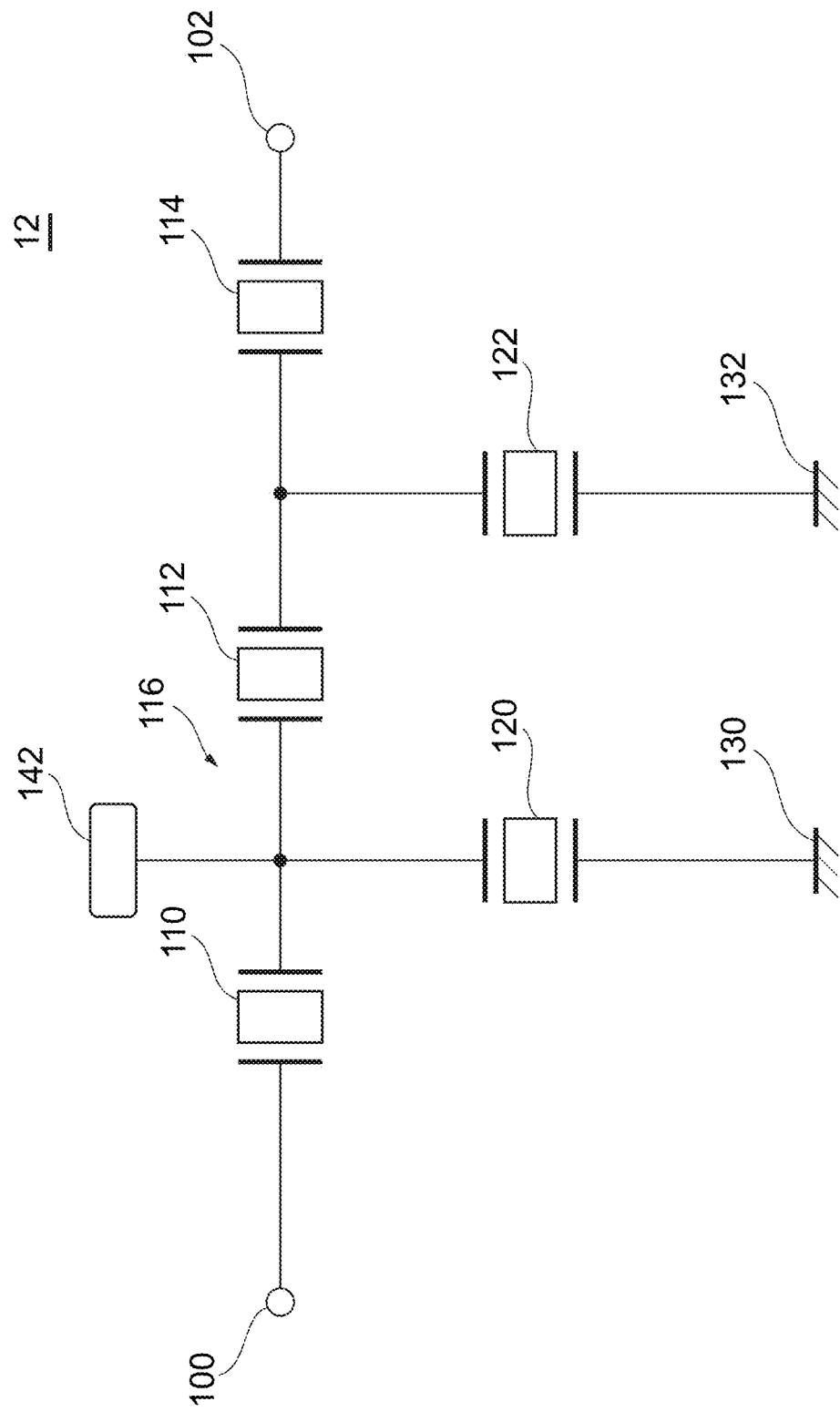
FIG. 9 is a circuit diagram of a filter device according to a second preferred embodiment of the present invention.

FIG. 9 is a circuit diagram of a filter device 12 according to a second preferred embodiment of the present invention. In the filter device 12 of the second preferred embodiment, an open terminal 142 is connected to a node between the series arm resonator 110, which is closest to the input terminal 100, and the series arm resonator 112, which is second closest to the input terminal 100. The parallel arm resonator 120 is also connected to this node.

The electrode forming the open terminal 142 is connected to an open electrode (open portion) provided in or on the multilayer substrate. Heat generated in the series arm resonators 110 and 112, for example, is thus dissipated via the open portion. As a result, the electric power handling capability of the filter device 12 is improved.

Third Preferred Embodiment

Figure 10:
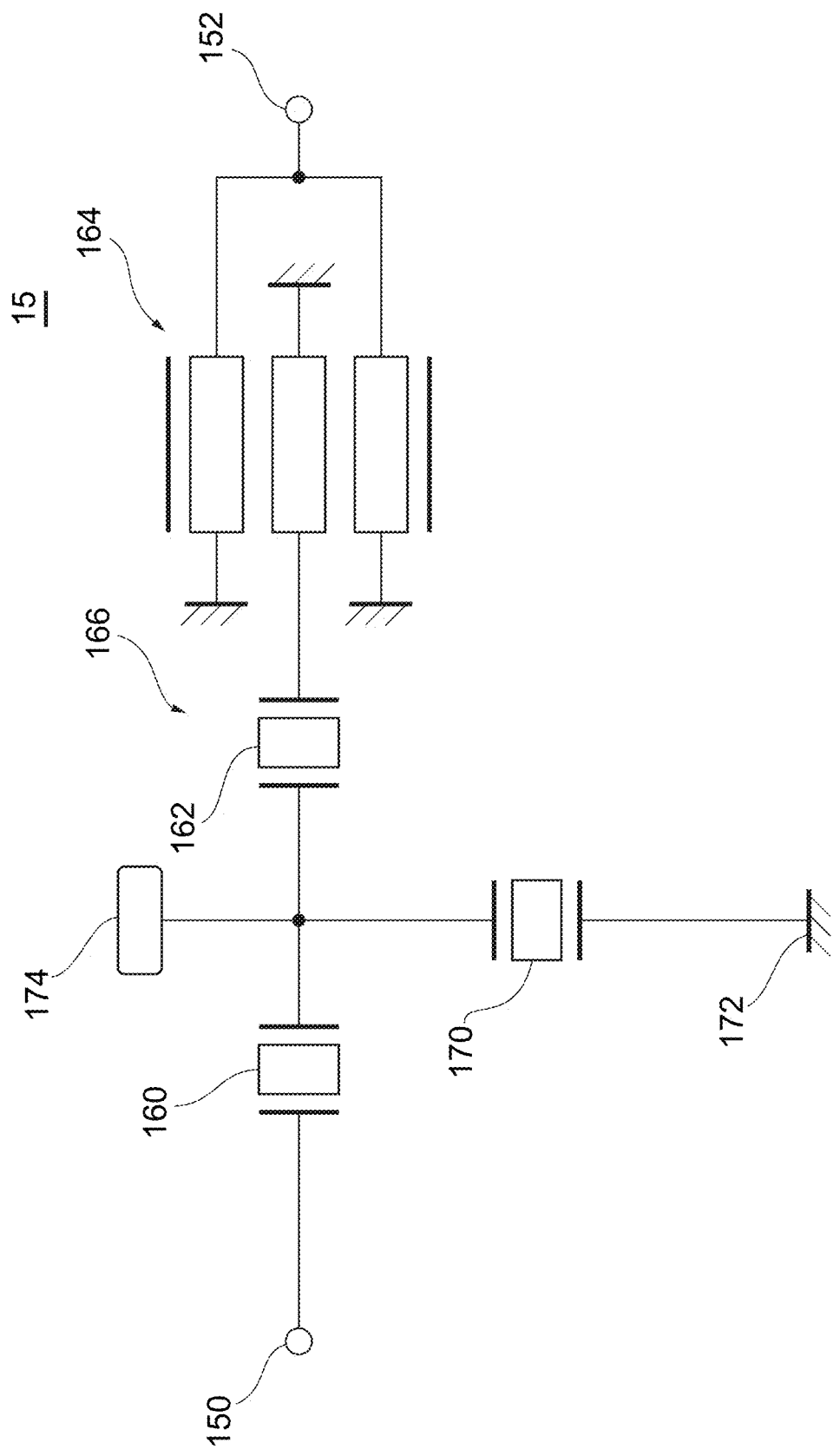
FIG. 10 is a circuit diagram of a filter device according to a third preferred embodiment of the present invention.

FIG. 10 is a circuit diagram of a filter device 15 according to a third preferred embodiment of the present invention. In the filter device 15 of the third preferred embodiment, on a path (first connecting path 166) which connects an input terminal 150 and an output terminal 152, two series arm resonators 160 and 162 and a longitudinally coupled resonator unit 164 are disposed in this order as viewed from the input terminal 150. The longitudinally coupled resonator unit 164 includes three resonators that are each connected to a ground terminal. A resonator 170 is connected to a node between the resonators 160 and 162. The resonator 170 is connected to a ground terminal 172.

In the third preferred embodiment, an open terminal 174 is connected to a node between the resonators 160 and 162. The electrode defining the open terminal 174 is connected to an open electrode (open portion) provided in or on the multilayer substrate. Heat generated in the resonators 160 and 162 and the longitudinally coupled resonator unit 164 is thus dissipated via the open portion. As a result, the electric power handling capability of the filter device 15 is improved.

Fourth Preferred Embodiment

Figure 11:
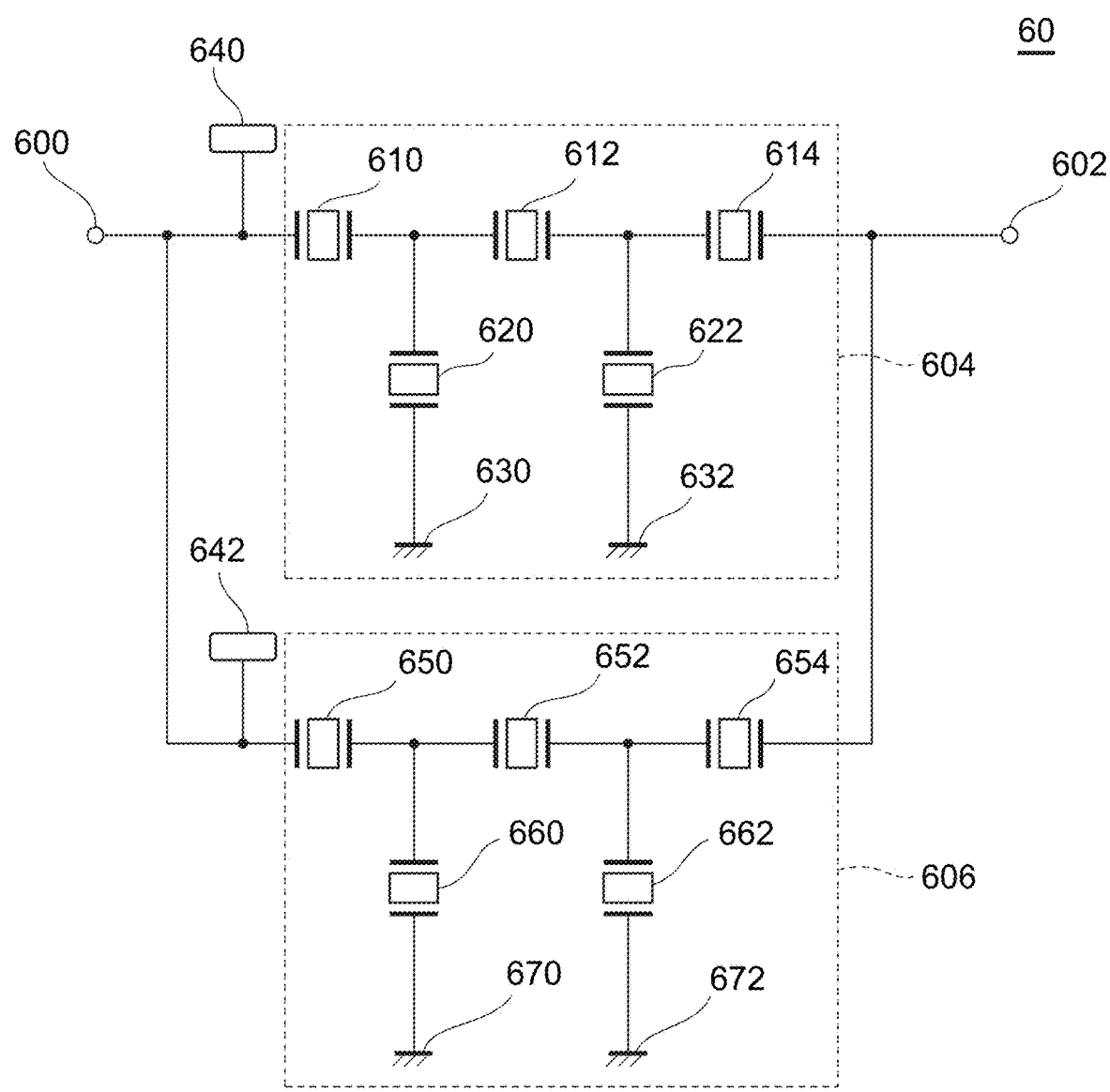
FIG. 11 is a circuit diagram of a filter device according to a fourth preferred embodiment of the present invention.

FIG. 11 is a circuit diagram of a filter device 60 according to a fourth preferred embodiment of the present invention. The filter device 60 includes an input terminal 600, an output terminal 602, a first filter 604, a second filter 606, and open terminals 640 and 642.

The first filter 604 includes series arm resonators 610, 612, and 614, parallel arm resonators 620 and 622, and ground terminals 630 and 632. The second filter 606 includes series arm resonators 650, 652, and 654, parallel arm resonators 660 and 662, and ground terminals 670 and 672. The configuration of each of the first and second filters 604 and 606 is the same or substantially the same as that of the filter 104 described with reference to FIG. 1, and a detailed explanation thereof will thus be omitted.

The open terminals 640 and 642 are connected to a path which connects the input terminal 600 and the output terminal 602. More specifically, the open terminal 640 is connected to a node between the input terminal 600 and the series arm resonator 610 of the first filter 604, while the open terminal 642 is connected to a node between the input terminal 600 and the series arm resonator 650 of the second filter 606.

In the filter device 60 of the fourth preferred embodiment, heat generated in the resonators included in the first and second filters 604 and 606 is dissipated via the electrodes defining the open terminals 640 and 642. As a result, the electric power handling capability of the filter device 60 is improved.

Fifth Preferred Embodiment

Figure 12:
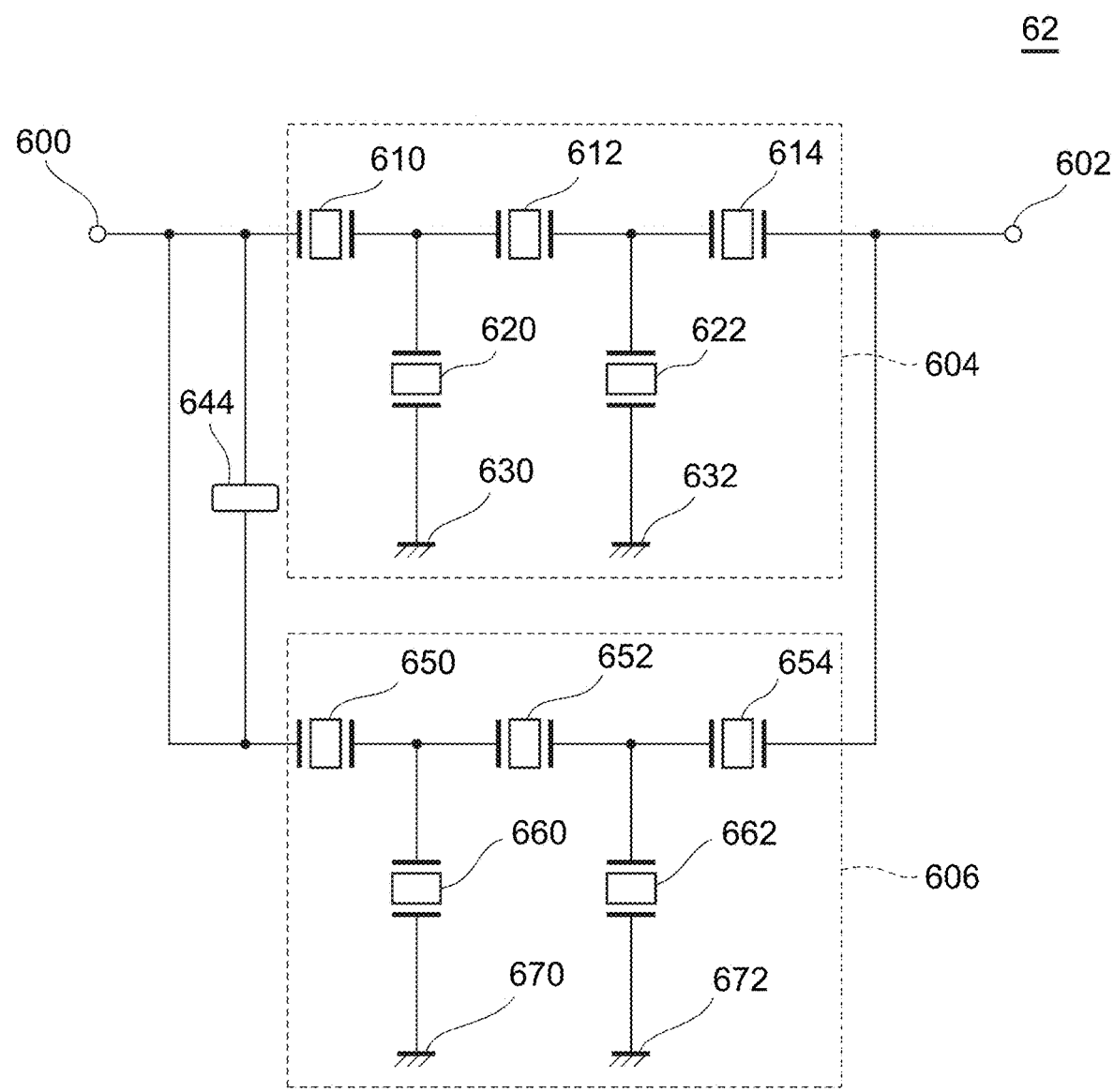
FIG. 12 is a circuit diagram of a filter device according to a fifth preferred embodiment of the present invention.

FIG. 12 is a circuit diagram of a filter device 62 according to a fifth preferred embodiment. In the filter device 62 of the fifth preferred embodiment, unlike the filter device 60 of the fourth preferred embodiment, only one open terminal 644 is electrically connected to the first filter 604 and the second filter 606. More specifically, one end of the open terminal 644 is connected to a node between the input terminal 600 and the series arm resonator 610 of the first filter 604, while the other end of the open terminal 644 is connected to a node between the input terminal 600 and the series arm resonator 650 of the second filter 606.

The filter device 62 of the fifth preferred embodiment achieves a simpler configuration than the filter device 60 of the fourth preferred embodiment.

First Applied Example

Figure 13:
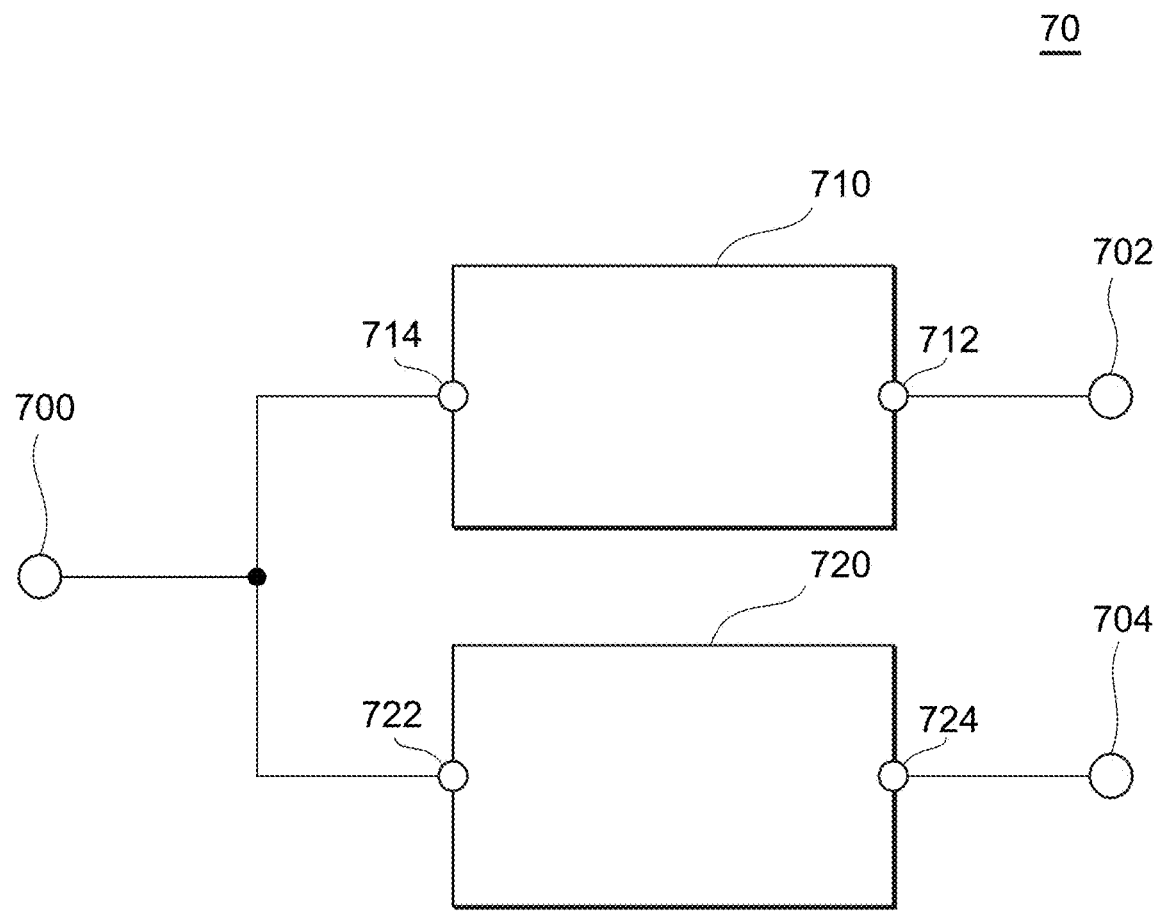
FIG. 13 illustrates a composite filter device according to a first applied example of a preferred embodiment of the present invention.

FIG. 13 illustrates a composite filter device 70 (duplexer) according to a first applied example of a preferred embodiment of the present invention. The composite filter device 70 of the first applied example includes a common terminal 700, a first terminal 702, a second terminal 704, a transmit filter 710, and a receive filter 720.

The common terminal 700 is provided for both of the transmit filter 710 and the receive filter 720. The common terminal 700 is connected to an output terminal 714 of the transmit filter 710 and an input terminal 722 of the receive filter 720. An antenna (not shown) is connected to the common terminal 700. An input terminal 712 of the transmit filter 710 is connected to the first terminal 702. An output terminal 724 of the receive filter 720 is connected to the second terminal 704.

A transmit signal output from a transmit circuit (not shown) is supplied to the transmit filter 710 via the first terminal 702 and the input terminal 712. The transmit filter 710 is a band pass filter which allows a transmit signal of a predetermined frequency band to pass from the input terminal 712 to the output terminal 714 and which attenuates transmit signals of the other frequency bands. The transmit signal passed through the transmit filter 710 is sent to the common terminal 700 and is sent from the antenna to a base station.

A signal received from a base station via the antenna is supplied to the receive filter 720 via the common terminal 700 and the input terminal 722. The receive filter 720 is a band pass filter which allows a received signal of a predetermined frequency band to pass therethrough and attenuates received signals of the other frequency bands. The received signal passed through the receive filter 720 is sent to a receive circuit (not shown) via the output terminal 724 and the second terminal 704.

One of the filter devices of the above-described first through fifth preferred embodiments is applicable to at least one of the transmit filter 710 and the receive filter 720. In this case, heat is dissipated via an open terminal included in the composite filter device 70. As a result, the electric power handling capability of the composite filter device 70 is improved.

Second Applied Example

Figure 14:
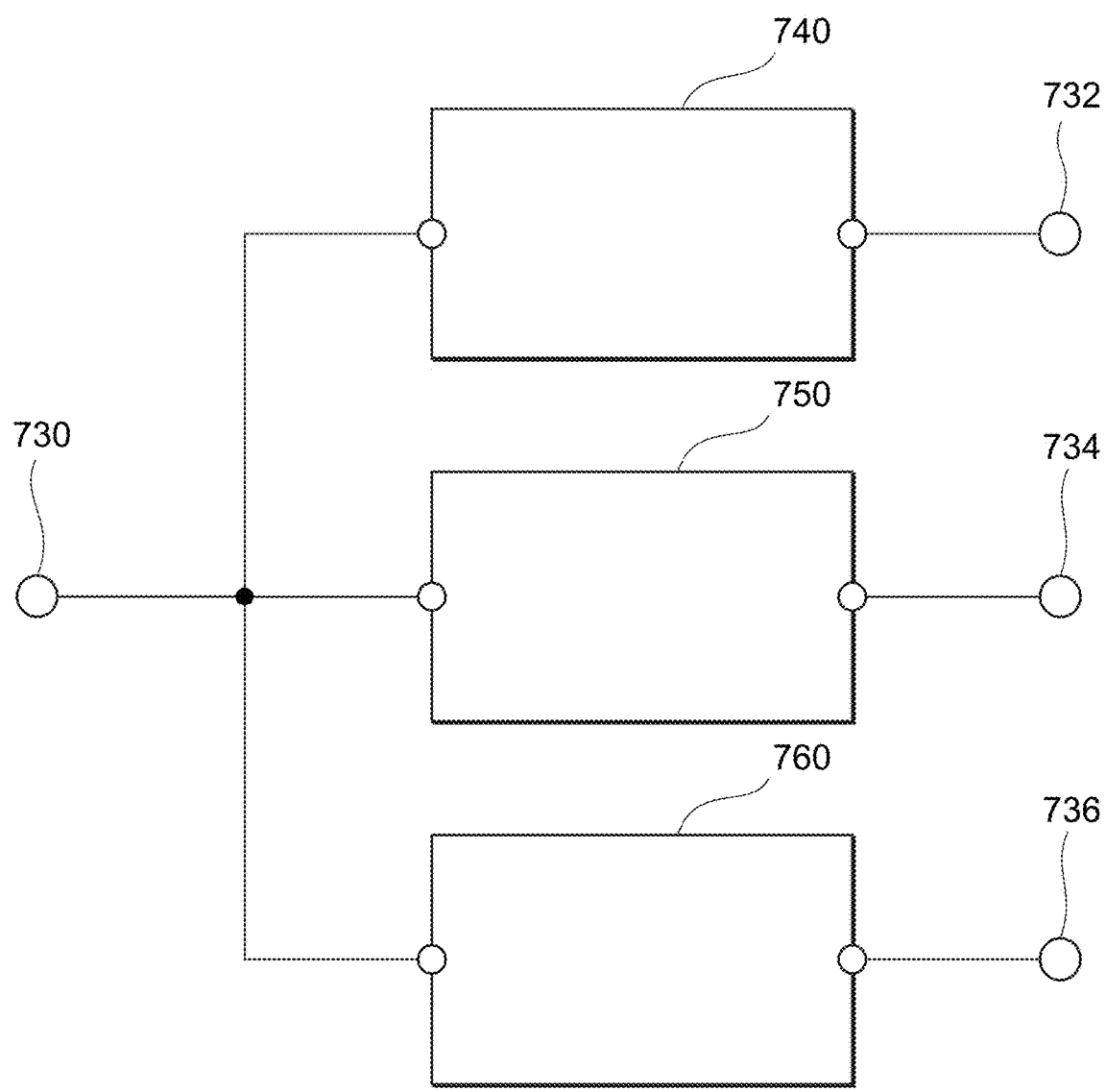
FIG. 14 illustrates a composite filter device according to a second applied example of a preferred embodiment of the present invention.

FIG. 14 illustrates a composite filter device 73 according to a second applied example of a preferred embodiment of the present invention. The composite filter device 73 of the second applied example includes a common terminal 730, a third terminal 732, a fourth terminal 734, a fifth terminal 736, and three filters 740, 750, and 760. The common terminal 730 is connected to the three filters 740, 750, and 760. The filter 740 is connected to the third terminal 732, the filter 750 is connected to the fourth terminal 734, and the filter 760 is connected to the fifth terminal 736.

Each of the three filters 740, 750, and 760 is a receive filter or a transmit filter. One of the filter devices of the above-described first through fifth preferred embodiments is applicable to at least one of the filters 740, 750, and 760. As a result, the electric power handling capability of the composite filter device 73 is improved.

All or some of preferred embodiments of the present invention will be described below together with the advantages thereof. Nevertheless, the preferably invention is not restricted to the following description.

According to a preferred embodiment of the present invention, a filter device 2 includes a multilayer substrate 400, an input electrode 424 (first input electrode) provided on the multilayer substrate 400, an output electrode 484 (first output electrode) provided on the multilayer substrate 400, a ground electrode 464 (first ground electrode) provided on the multilayer substrate 400 and connected to a ground potential, an open portion 43 that is electrically open and provided in or on the multilayer substrate 400, a piezoelectric substrate 300 mounted on the multilayer substrate 400, an input electrode 310 (second input electrode) provided on a surface of the piezoelectric substrate 300 and connected to the input electrode 424, an output electrode 316 (second output electrode) provided on the surface of the piezoelectric substrate 300 and connected to the output electrode 484, a ground electrode 314 (second ground electrode) provided on the surface of the piezoelectric substrate 300 and connected to the ground electrode 464, and at least one of IDT electrodes 320, 322, and 324 (first functional electrodes) are provided on the surface of the piezoelectric substrate 300 and disposed on a first connecting path 116, the first connecting path 116 connecting the input electrode 310 and the output electrode 316. The open portion 43 is connected to the first connecting path 116.

With the above-described configuration, the open portion 43 is able to dissipate heat generated in the resonators defined by the IDT electrodes provided on the piezoelectric substrate 300. This can regulate a temperature rise in the resonators, for example, and high electric power can safely be input into the filter device 2. It is thus possible to provide a filter device 2 that can improve the electric power handling capability.

In the filter device 2, among the IDT electrodes 320, 322, and 324 disposed on the first connecting path 116, the open portion 43 is preferably electrically connected to the IDT electrode 320 which is located electrically most closely to the input electrode 310 (second input electrode).

As an IDT electrode is located more closely to the input electrode 310, a greater amount of heat is generated in this IDT electrode. The IDT electrode 320 positioned electrically most closely to the input electrode 310 generates the greatest amount of heat among the IDT resonators 320, 322, and 324 disposed on the first connecting path 116. By connecting the open portion 43 to the IDT electrode 320, a temperature rise in the IDT electrodes can be regulated more effectively. This can improve the electric power handling capability of the filter device 2 more effectively.

In the filter device 2, preferably, the multilayer substrate 400 is used as the first substrate, the open portion 43 includes a plurality of electrodes 430, 434, and 440 which are provided on multiple layers of the multilayer substrate 400 and which are electrically connected with each other, and one of the plurality of electrodes 430, 434, and 440 is the electrode 430 (connecting electrode) which is provided on a surface of the multilayer substrate 400 and which is connected to the first connecting path 116.

The open portion 43 is defined by plurality of electrodes, which can efficiently increase the surface area of the open portion 43, thus further regulating a temperature rise in the resonators. As a result, the electric power handling capability of the filter device 2 is further improved.

In the filter device 2, the area of the electrode 430 (connecting electrode) may preferably be larger than that of the other electrodes 434 and 440.

As the area of the electrode 430 connected to the first connecting path 116 is larger, heat can be dissipated more efficiently and the power handling capability of the filter device 2 can be further improved. As the area of the other electrodes defining the open portion 43 is smaller, the influence on a signal transmitted through the first connecting path 116 can be reduced. Since the area of the electrode 430 is larger than that of the other electrodes 434 and 440, it is possible to reduce the influence of the open portion 43 on a signal transmitted through the first connecting path 116 while improving the power handling capability of the filter device 2.

According to a preferred embodiment of the present invention, a filter device 10 including an input terminal 100, an output terminal 102, at least one resonator (series arm resonators 110, 112, and 114) disposed on a connecting path (first connecting path 116), the connecting path connecting the input terminal 100 and the output terminal 102, and an open terminal 140 that is electrically open and is connected to the connecting path.

The open terminal 140 defines and functions as an open stub. Unwanted harmonic wave components are thus reflected due to impedance mismatching. A signal reflected by the open stub is out of phase with harmonic wave components input into the filter device 10 by about 180°. The reflected signal thus cancels out the unwanted harmonic wave components. As a result, the bandpass characteristics and attenuation characteristics of the filter device 10 are improved.

The above-described preferred embodiments are provided to facilitate the understanding of the present invention, but are not intended to be exhaustive or to limit the present invention to the precise configurations disclosed. Modifications and/or improvements may be made without departing from the scope and spirit of the present invention, and equivalents of the present invention are also encompassed in the present invention. That is, suitable design changes made to the preferred embodiments by those skilled in the art are also encompassed in the present invention within the scope and spirit of the present invention. For example, the elements of the preferred embodiments and the positions, materials, conditions, configurations, and sizes thereof are not restricted to those described in the preferred embodiments and may be changed in an appropriate manner. The elements of the different preferred embodiments may be partially replaced by or combined with each other, and configurations obtained by replacing or combining the elements of the preferred embodiments are also encompassed in the present invention within the scope and spirit of the present invention.

In the above-described preferred embodiments, the series arm resonators disposed on the series arm are all connected in series with each other. However, the resonators disposed on the series arm may include resonators connected in parallel with each other. This can reduce power consumption per resonator and accordingly lower the amount of heat generated in the resonators. As a result, the electric power handling capability of the filter device is further improved. The resonant frequencies of parallel-connected resonators may be different from each other. This improves the attenuation characteristics of the filter device.

In the first and second applied examples, the composite filter devices include two or three filters. However, a composite filter device may include four or more filters. The filters included in a composite filter device may be multiple receive filters, multiple transmit filters, or a combination of one or more receive filters and one or more transmit filters.

Figure 15:
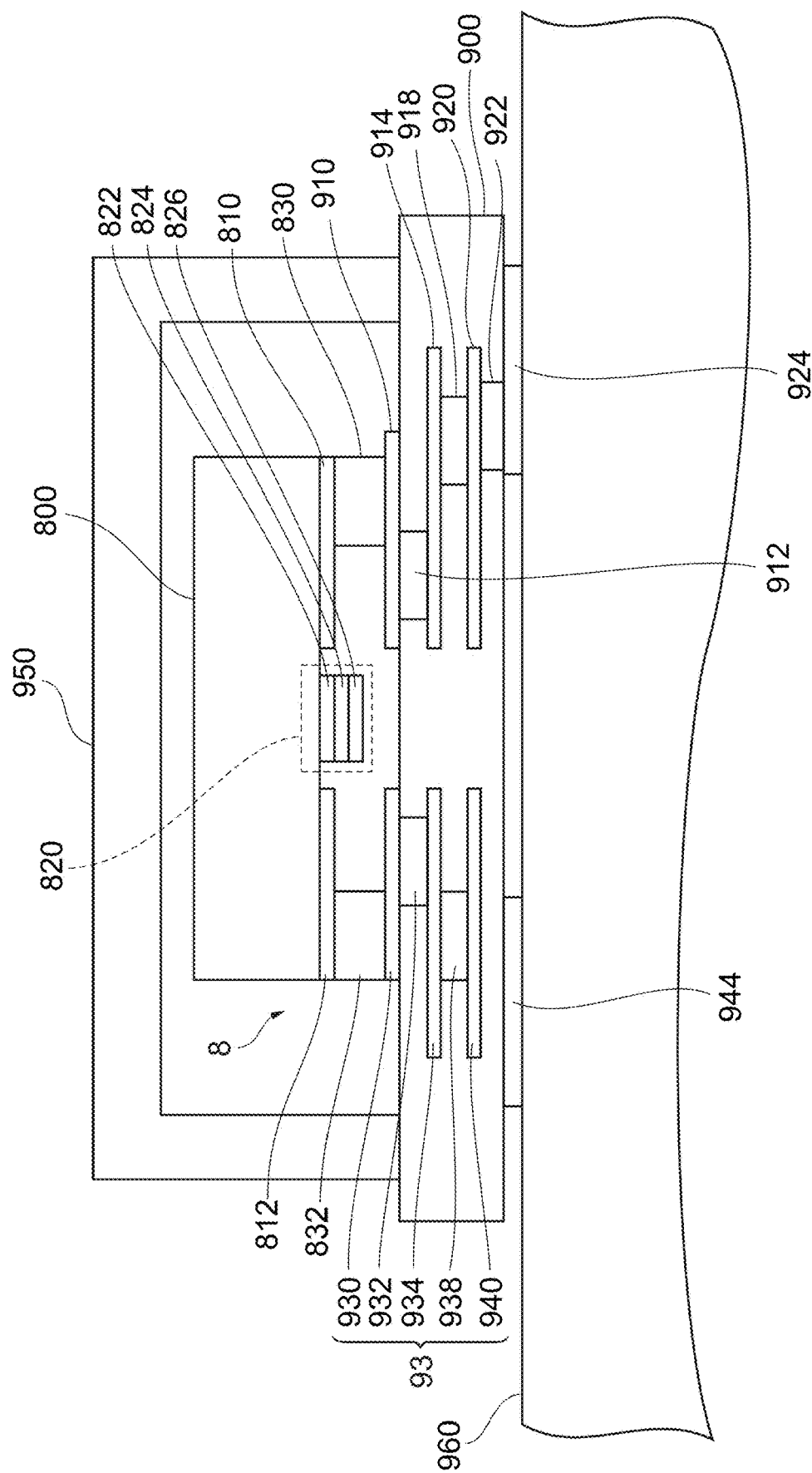
FIG. 15 is a schematic sectional view of a filter device including a bulk acoustic wave (BAW) resonator.

In the above-described preferred embodiments, resonators used in each of the filter devices are SAW resonators. The resonators may alternatively include a BAW resonator, for example. FIG. 15 is a schematic sectional view of a filter device 8 including a BAW resonator according to a preferred embodiment of the present invention. As shown in FIG. 15, the filter device 8 includes a first substrate 900 and a second substrate 800. The second substrate 800 is covered with a cover member 950.

On the second substrate 800, a piezoelectric film 824 and functional electrodes 822 and 826 sandwiching the piezoelectric film 824 are provided. The piezoelectric film 824 and the functional electrodes 822 and 826 define a piezoelectric element 820. In the present preferred embodiment, the piezoelectric element 820 defines and functions as a BAW resonator. Each of the functional electrodes 822 and 826 may be a first functional electrode or a second functional electrode.

Various electrodes are provided in or on the first substrate 900. For example, an open portion 93 including a plurality of electrodes is provided in or on the first substrate 900. The open portion 93 includes three electrodes 930, 934, and 940, for example. The electrodes 930 and 934 are connected with each other by a via-hole electrode 932 interposed therebetween. The electrodes 934 and 940 are connected with each other by a via-hole electrode 938 interposed therebetween. An electrode 944 provided on the bottom surface of the first substrate 900 is not electrically connected to the open portion 93. The electrode 930 is connected to an electrode 812 provided on the surface of the second substrate 800 via a bump 832. The open portion 93 can dissipate heat from the resonator, thus improving the electric power handling capability of the filter device 8.

Various electrodes, which cause the filter device 8 to function, are provided on the first substrate 900. For example, an input electrode 924 (first input electrode) to which an input potential is supplied from a motherboard 960 is provided on the first substrate 900. The input electrode 924 is connected to an electrode 910 provided on the top surface of the first substrate 900 via electrodes 920 and 914 and via-hole electrodes 922, 918, and 912. The electrode 910 is connected to an input electrode 810 (second input electrode) provided on the surface of the second substrate 800 via a bump 830.

A second ground electrode and a second output electrode may be provided on the surface of the second substrate 800. A first ground electrode and a first output electrode may be provided on the first substrate 900.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a first substrate;
a first input electrode on the first substrate;
a first output electrode on the first substrate;
a first ground electrode on the first substrate and that receives a ground potential;
an open portion that is electrically open and provided in or on the first substrate;
a second substrate mounted on the first substrate;
a second input electrode on a surface of the second substrate and connected to the first input electrode;
a second output electrode on the surface of the second substrate and connected to the first output electrode;
a second ground electrode on the surface of the second substrate and connected to the first ground electrode; and
at least one first functional electrode on the surface of the second substrate and disposed on a first connecting path, the first connecting path connecting the second input electrode and the second output electrode; wherein
the open portion is connected to the first connecting path;
the first substrate is a multilayer substrate;
the open portion includes a plurality of electrodes on a plurality of layers of the multilayer substrate and being electrically connected with each other;
the plurality of electrodes include a connecting electrode on a surface of the multilayer substrate and which is connected to the first connecting path; and
the connecting electrode has a larger area than the plurality of electrodes other than the connecting electrode.

2. The filter device according to claim 1, wherein, among the at least one first functional electrode disposed on the first connecting path, the open portion is electrically connected to a first functional electrode located electrically most closely to the second input electrode.

3. The filter device according to claim 1, further comprising a second functional electrode disposed on a second connecting path, the second connecting path connecting the first connecting path and the second ground electrode.

4. The filter device according to claim 3, wherein the second functional electrode is a surface acoustic wave resonator.

5. The filter device according to claim 3, wherein
a plurality of the second functional electrodes and a plurality of the second connecting paths are provided; and
each of the plurality of second functional electrodes are respectively provided on a respective one of the plurality of second connecting paths.

6. A composite filter device comprising:
a receive filter; and
a transmit filter; wherein
at least one of the receive filter and the transmit filter includes the filter device according to claim 1.

7. The composite filter device according to claim 6, wherein, among the at least one first functional electrode disposed on the first connecting path, the open portion is electrically connected to a first functional electrode located electrically closest to the second input electrode.

8. The composite filter device according to claim 6, further comprising a second functional electrode disposed on a second connecting path, the second connecting path connecting the first connecting path and the second ground electrode.

9. The composite filter device according to claim 8, wherein the second functional electrode is a parallel arm resonator.

10. The composite filter device according to claim 8, wherein
- a plurality of the second functional electrodes and a plurality of the second connecting paths are provided; and
- each of the plurality of second functional electrodes are respectively provided on a respective one of the plurality of second connecting paths.

11. The composite filter device according to claim 6, wherein the at least one first functional electrode is a surface acoustic wave resonator.

12. The composite filter device according to claim 6, wherein the at least one first functional electrode includes a plurality of functional electrodes.

13. The filter device according to claim 1, wherein the at least one first functional electrode is a surface acoustic wave resonator.

14. The filter device according to claim 1, wherein the at least one first functional electrode includes a plurality of functional electrodes.

15. The filter device according to claim 1, wherein the at least one first functional electrode is a bulk acoustic wave resonator.

\* \* \* \* \*